United States Patent
Lee

(10) Patent No.: US 7,911,868 B2
(45) Date of Patent: Mar. 22, 2011

(54) SELF-REFRESH PERIOD MEASUREMENT CIRCUIT OF SEMICONDUCTOR DEVICE

(75) Inventor: Kyong Ha Lee, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 258 days.

(21) Appl. No.: 12/319,877

(22) Filed: Jan. 13, 2009

(65) Prior Publication Data

US 2009/0180336 A1    Jul. 16, 2009

Related U.S. Application Data

(62) Division of application No. 11/497,899, filed on Aug. 1, 2006, now Pat. No. 7,486,583.

(30) Foreign Application Priority Data

Nov. 29, 2005 (KR) ............................... 2005-115131

(51) Int. Cl.
*G11C 7/00* (2006.01)
(52) U.S. Cl. ....................................... 365/222; 365/201
(58) Field of Classification Search .................. 365/222, 365/201, 194
See application file for complete search history.

(56) References Cited

U.S. PATENT DOCUMENTS

| 5,467,315 | A | * | 11/1995 | Kajimoto et al. | ........ 365/189.15 |
|---|---|---|---|---|---|
| 5,495,452 | A | | 2/1996 | Cha | |
| 5,532,968 | A | | 7/1996 | Lee | |
| 5,568,440 | A | * | 10/1996 | Tsukude et al. | .............. 365/222 |
| 5,680,359 | A | | 10/1997 | Jeong | |
| 6,611,470 | B2 | * | 8/2003 | Hidaka | ......................... 365/222 |
| 2005/0052919 | A1 | | 3/2005 | Chou | |
| 2005/0243629 | A1 | | 11/2005 | Lee | |
| 2006/0023546 | A1 | | 2/2006 | Park | |

FOREIGN PATENT DOCUMENTS

| JP | 07-073668 | 3/1995 |
|---|---|---|
| JP | 2006-048845 | 2/2006 |

* cited by examiner

*Primary Examiner* — Anh Phung
(74) *Attorney, Agent, or Firm* — John P. White; Cooper & Dunham LLP

(57) ABSTRACT

A self-refresh period measurement circuit of a semiconductor device is disclosed, herein which includes a period measurement start signal generator configured to receive a self-refresh signal and an oscillation signal, to allow a self-refresh operation to be performed, and generate a period measurement start signal, to set the time that the oscillation signal is enabled, and a refresh period output unit configured to receive the period measurement start signal and the oscillation signal, and generate a refresh period output signal that is enabled for a period from the time that the period measurement start signal is enabled to a time that the oscillation signal is enabled.

9 Claims, 7 Drawing Sheets

SELF-REFRESH PERIOD MEASUREMENT CIRCUIT OF SEMICONDUCTOR DEVICE

This application is a divisional of U.S. Ser. No. 11/497,899, filed Aug. 1, 2006, now U.S. Pat. No. 7,486,583; issued on Feb. 3, 2009, which claims priority of Korean Patent Application No. 2005-115131, filed Nov. 29, 2005, the contents of which are hereby incorporated by reference into this application.

BACKGROUND

1. Field of the Disclosure

The present disclosure relates to a self-refresh period measurement circuit of a semiconductor device, and more particularly to a self-refresh period measurement circuit of a semiconductor device which is capable of measuring a more accurate self-refresh period of the semiconductor device.

2. Description of the Related Art

One of the most important matters in mobile products such as mobile phones, notebook computers, etc., is how long the products can successfully be operated with given batteries. In this regard, it is very important in mobile dynamic random access memories (DRAMs) installed in such products to reduce self-refresh current that is generated in a standby state of the DRAMs.

Functions such as a Partial Array Self Refresh (PASR) mode, Temperature Compensated Self Refresh (TCSR) mode and Deep Power Down (DPD) mode are generally installed in such mobile products to reduce self-refresh current of the products so as to reduce power consumption thereof. Among these, the PASR mode and TCSR mode are programmed and used by the user to utilize Extended Mode Register Set (EMRS) feature.

In general, the data preservation time of a device at low temperature is longer than that at high temperature. In this regard, a TCSR circuit can reduce power consumption of a DRAM by varying a self-refresh period of the DRAM with temperature in such a manner as to shorten the self-refresh period when the DRAM is used at high temperature and lengthen the self-refresh period when the DRAM is used at low temperature. In particular, in an auto TCSR circuit, a temperature setting is not performed by the user, but the temperature of a chip is sensed and the period of an oscillation signal for a refresh operation is automatically adjusted according to the sensed temperature.

In order to automatically adjust a self-refresh period of a semiconductor device such as a mobile DRAM or the like according to temperature to reduce current consumption of the semiconductor device as stated above, it is very important to measure how long the self-refresh period actually is. However, a conventional self-refresh period measurement circuit has a disadvantage in that operation characteristics thereof are unstable when measuring a self-refresh period, as will hereinafter be described in detail with reference to FIG. 1.

FIG. 1 is a timing diagram showing the waveforms of respective signals in a conventional self-refresh period measurement circuit. Here, a control signal TM_REF is a test mode signal that enables a test mode for measuring a self-refresh period. A control signal OSC_MEAS_ON is a pulse that is enabled high in level when a semiconductor device enters a self-refresh mode, to indicate that the semiconductor device has entered the self-refresh mode. The semiconductor device performs a first cycle of a self-refresh operation (also referred to hereinafter as a "first self-refresh cycle") at a time t2 that the control signal OSC_MEAS_ON is enabled. A control signal OSC is an oscillation signal that is periodically enabled after the semiconductor device enters the self-refresh mode, to allow the self-refresh operation to be periodically performed. The semiconductor device performs the self-refresh operation each time the control signal OSC makes a high level transition. The control signal OSC allows the self-refresh operation to be performed periodically beginning with a second cycle.

The self-refresh period is conventionally measured by measuring a period corresponding to the first cycle of the self-refresh operation, namely, a period between the enable time t2 of the control signal OSC_MEAS_ON and an enable time t3 of the oscillation signal OSC, as shown in FIG. 1. That is, the conventional self-refresh period measurement circuit generates a refresh period output signal REF_OSC that is enabled for the period from the time t2 that the control signal OSC_MEAS_ON is enabled to the time t3 that the oscillation signal OSC is enabled for the first time. The conventional circuit then measures the self-refresh period by counting the number of specific signals, such as clocks with a certain period, strobed for the enable period (from t2 to t3).

However, an oscillator of an auto TCSR circuit is liable to operate unstably in the first self-refresh cycle that is performed simultaneously with the self-refresh mode entry. For this reason, it is unreasonable to recognize that the measurement result of the period of the first self-refresh cycle represents an accurate self-refresh period. Nevertheless, the conventional self-refresh period measurement circuit takes, as the self-refresh period, the period in which the refresh period output signal REF_OSC is enabled, namely, the period in which the first self-refresh cycle is performed, as described above, so that it cannot measure an accurate period of the self-refresh operation, thereby causing the auto TCSR circuit not to perform the self-refresh operation appropriately for the chip temperature.

SUMMARY

Therefore, the present disclosure provides a number of examples and illustrative embodiments of a self-refresh period measurement circuit of a semiconductor device which is capable of measuring a more accurate self-refresh period of the semiconductor device by measuring the period of a second or subsequent self-refresh cycle exhibiting more stable and normal characteristics than a first self-refresh cycle.

In accordance with an aspect of the present disclosure, there is provided a self-refresh period measurement circuit of a semiconductor device comprising: a delay device configured to receive an oscillation signal that is periodically enabled after a self-refresh signal is enabled, to allow a self-refresh operation to be performed, and delay the received oscillation signal by a unit self-refresh period to output a delayed oscillation signal; a period measurement start signal generator for receiving the self-refresh signal and the oscillation signal and generating a period measurement start signal for setting a time that the oscillation signal is enabled for the first time as a start time for measurement of a self-refresh period; and a refresh period output unit for receiving the period measurement start signal and the delayed oscillation signal from the delay device and generating a refresh period output signal that is enabled for a period from a time that the period measurement start signal is enabled to a time that the delayed oscillation signal is enabled for the first time.

The delay device may be a shift register which shifts the oscillation signal by the unit self-refresh period.

The shift register may be enabled by a test mode signal for the self-refresh period measurement.

Preferably, the period measurement start signal generator comprises: a pull-up device for pulling a specific node up in response to the self-refresh signal; a pull-down device for pulling the node down in response to the oscillation signal; a latch for latching a signal of the node; and a signal generator for outputting a pulse signal that is enabled for a predetermined period from a time that an output signal from the latch makes a level transition, as the period measurement start signal, in response to the level transition of the output signal from the latch.

Preferably, the signal generator comprises: a delay for delaying the output signal from the latch by the predetermined period; a buffer for buffering the output signal from the latch; and a logic device for performing a logic operation with respect to an output signal from the delay and an output signal from the buffer.

The buffer may be an inverter which performs an inverting operation.

The logic device may perform a NOR operation.

Preferably, the refresh period output unit comprises: a first logic device for performing a logic operation with respect to the period measurement start signal and a test mode signal for the self-refresh period measurement; a second logic device for performing a logic operation with respect to the delayed oscillation signal and the test mode signal; and a latch including third and fourth logic devices interconnected in latch form, the third logic device receiving an output signal from the first logic device at its one input terminal, the fourth logic device receiving an output signal from the second logic device at its one input terminal.

Each of the first to fourth logic devices may be a NAND gate which performs a NAND operation.

The refresh period output unit may be operated in response to an enabled state of the test mode signal.

Preferably, the refresh period output unit further comprises voltage level hold means for holding an output terminal of the latch at a predetermined voltage level in response to the test mode signal.

In accordance with another aspect of the present disclosure, there is provided a self-refresh period measurement circuit of a semiconductor device comprising: a delay device for receiving an oscillation signal that is periodically enabled after a self-refresh signal is enabled, to allow a self-refresh operation to be performed, and delaying the received oscillation signal by a predetermined integer multiple of a unit self-refresh period to output a first delayed oscillation signal and by the predetermined integer multiple of the unit self-refresh period plus the unit self-refresh period to output a second delayed oscillation signal; a period measurement start signal generator for receiving the self-refresh signal and the first delayed oscillation signal and generating a period measurement start signal for setting a time that the first delayed oscillation signal is enabled for the first time as a start time for measurement of a self-refresh period; and a refresh period output unit for receiving the period measurement start signal and the second delayed oscillation signal and generating a refresh period output signal that is enabled for a period from a time that the period measurement start signal is enabled to a time that the second delayed oscillation signal is enabled for the first time.

In accordance with a further aspect of the present disclosure, there is provided a self-refresh period measurement circuit of a semiconductor device comprising: delay means for receiving an oscillation signal that is periodically enabled after a self-refresh signal is enabled, to allow a self-refresh operation to be performed, and delaying the received oscillation signal by a unit self-refresh period to output a first delayed oscillation signal, by a predetermined integer multiple of a unit self-refresh period to output a second delayed oscillation signal and by the predetermined integer multiple of the unit self-refresh period plus the unit self-refresh period to output a third delayed oscillation signal; a first period measurement start signal generator for receiving the self-refresh signal and the oscillation signal and generating a first period measurement start signal for setting a time that the oscillation signal is enabled for the first time as a start time for measurement of a self-refresh period; a second period measurement start signal generator for receiving the self-refresh signal and the second delayed oscillation signal and generating a second period measurement start signal for setting a time that the second delayed oscillation signal is enabled for the first time as the start time for the self-refresh period measurement; a first refresh period output unit for receiving the first period measurement start signal and the first delayed oscillation signal and generating a first refresh period output signal that is enabled for a period from a time that the first period measurement start signal is enabled to a time that the first delayed oscillation signal is enabled for the first time; and a second refresh period output unit for receiving the second period measurement start signal and the third delayed oscillation signal and generating a second refresh period output signal that is enabled for a period from a time that the second period measurement start signal is enabled to a time that the third delayed oscillation signal is enabled for the first time.

In accordance with yet another aspect of the present disclosure, there is provided a self-refresh period measurement circuit of a semiconductor device comprising: a period measurement start signal generator for receiving a self-refresh signal and an oscillation signal that is periodically enabled by a first width after the self-refresh signal is enabled, to allow a self-refresh operation to be performed, and generating a period measurement start signal that is enabled by a second width at a time that the oscillation signal is enabled for the first time, to set the time that the oscillation signal is enabled for the first time as a start time for measurement of a self-refresh period; and a refresh period output unit for receiving the period measurement start signal and the oscillation signal and generating a refresh period output signal that is enabled for a period from the time that the period measurement start signal is enabled to a time that the oscillation signal is enabled for the second time.

BRIEF DESCRIPTION OF DRAWINGS

The above and other objects, features and other advantages of the present disclosure will be more clearly understood from the following detailed description taken in conjunction with the accompanying drawings, in which.

DESCRIPTION OF PREFERRED EMBODIMENTS

Figure 1:
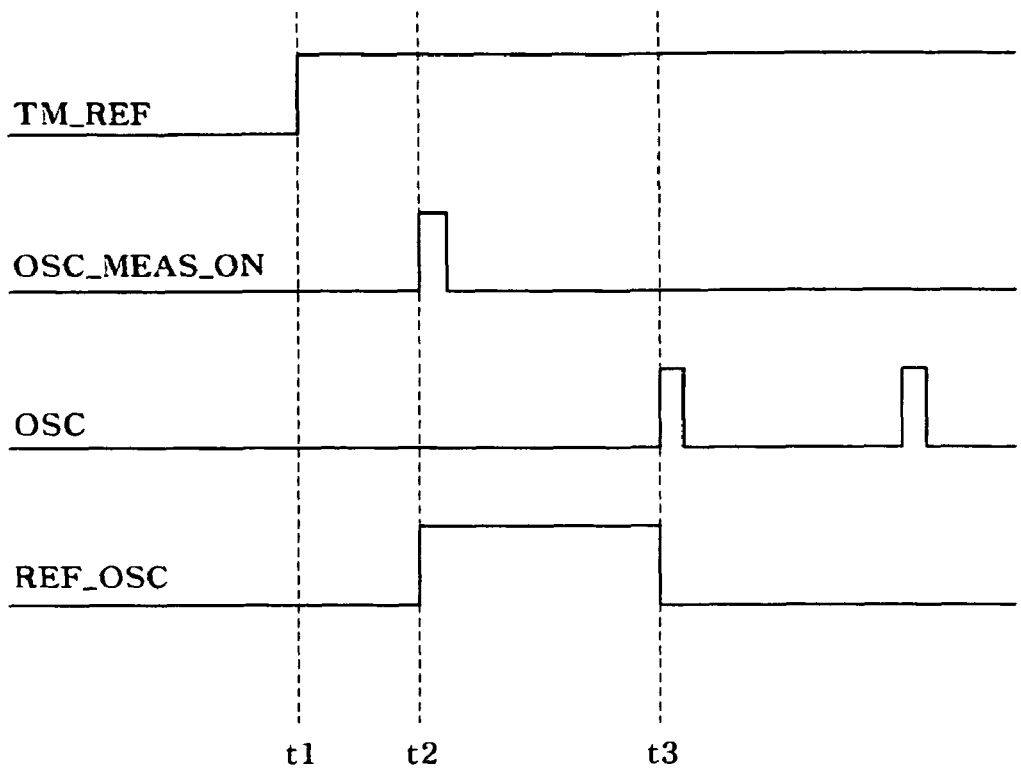
FIG. 1 is a timing diagram showing the waveforms of respective signals in a conventional self-refresh period measurement circuit.

Reference will now be made in detail to the preferred embodiments of the present disclosure, examples of which are illustrated in the accompanying drawings, wherein like reference numerals refer to like elements throughout. The embodiments are described below to explain the present disclosure by referring to the figures.

Figure 2A:
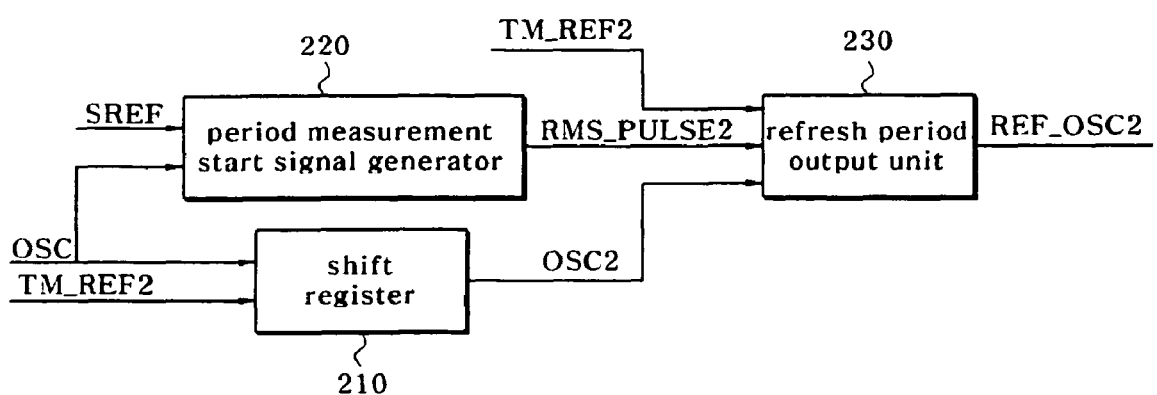
FIG. 2a is a block diagram showing the configuration of a self-refresh period measurement circuit of a semiconductor device according to a first embodiment of the present disclosure.
Figure 2B:
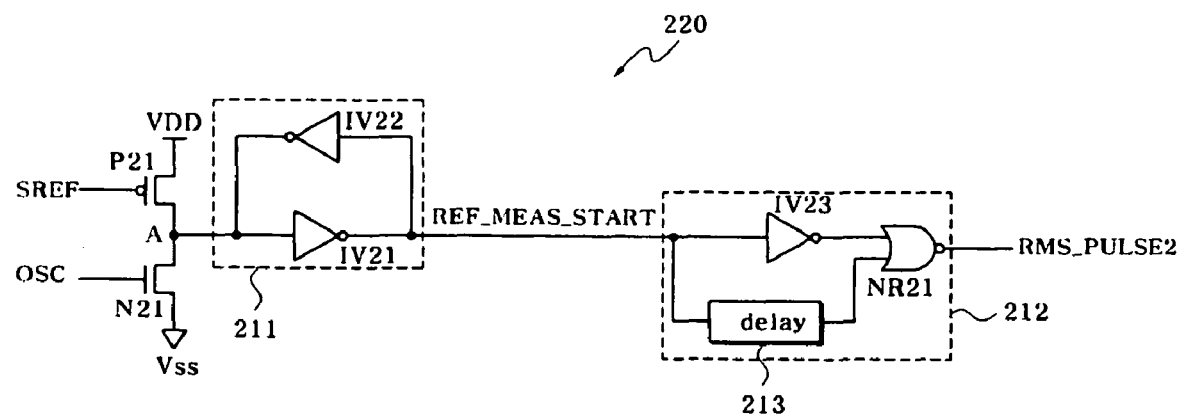
FIG. 2b is a circuit diagram of a period measurement start signal generator in the self-refresh period measurement circuit according to the first embodiment.
Figure 2C:
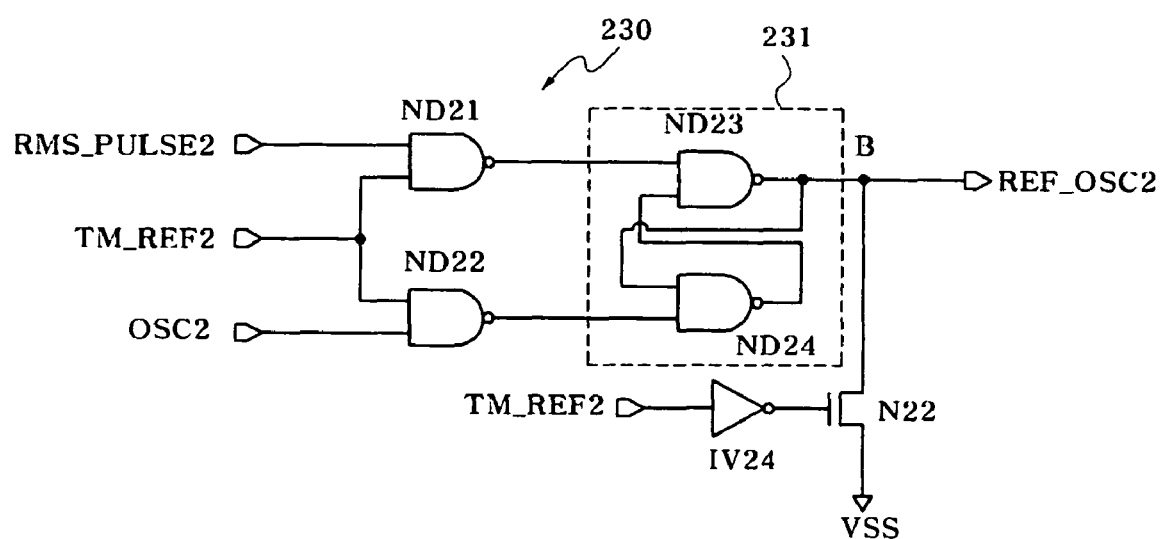
FIG. 2c is a circuit diagram of a refresh period output unit in the self-refresh period measurement circuit according to the first embodiment.
Figure 2D:
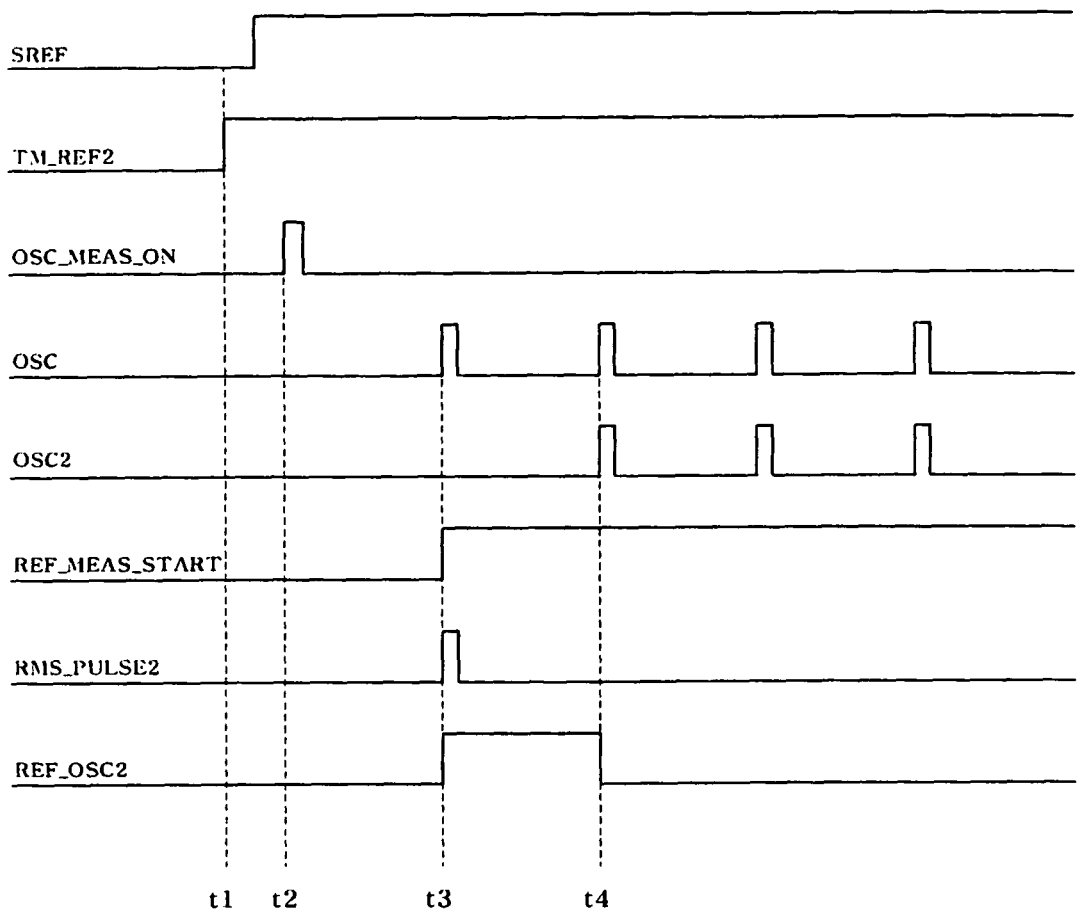
FIG. 2d is a timing diagram showing the waveforms of respective signals in the self-refresh period measurement circuit according to the first embodiment.

FIG. 2a is a block diagram showing the configuration of a self-refresh period measurement circuit of a semiconductor device according to a first embodiment of the present disclosure, FIG. 2b is a circuit diagram of a period measurement start signal generator in the first embodiment, FIG. 2c is a circuit diagram of a refresh period output unit in the first embodiment, and FIG. 2d is a timing diagram showing the waveforms of respective signals in the self-refresh period measurement circuit according to the first embodiment. The self-refresh period measurement circuit of the semiconductor device according to the first embodiment will hereinafter be described with reference to FIGS. 2a to 2d.

The self-refresh period measurement circuit according to the first embodiment comprises a shift register 210 for receiving an oscillation signal OSC that is periodically enabled after a self-refresh signal SREF is enabled, to allow a self-refresh operation to be performed, and delaying the received oscillation signal OSC by a unit self-refresh period to output a delayed oscillation signal OSC2, a period measurement start signal generator 220 for receiving the self-refresh signal SREF and the oscillation signal OSC and generating a period measurement start signal RMS_PULSE2 for setting a time that the oscillation signal OSC is enabled for the first time as a start time for measurement of a self-refresh period, and a refresh period output unit 230 for receiving the period measurement start signal RMS_PULSE2 and the delayed oscillation signal OSC2 from the shift register 210 and generating a refresh period output signal REF_OSC2 that is enabled for a period from a time that the period measurement start signal RMS_PULSE2 is enabled to a time that the delayed oscillation signal OSC2 is enabled for the first time.

The period measurement start signal generator 220 includes a P-channel MOS transistor (referred to hereinafter as a "PMOS") P21 for pulling a node A up in response to the self-refresh signal SREF, an N-channel MOS transistor (referred to hereinafter as an "NMOS") N21 for pulling the node A down in response to the oscillation signal OSC, a latch 211 for latching a signal of the node A, and a signal generator 212 for outputting a pulse signal that is enabled for a predetermined period from a time that an output signal REF_MEAS_START from the latch 211 makes a level transition, as the period measurement start signal RMS_PULSE2, in response to the level transition of the output signal REF_MEAS_START from the latch 211.

The refresh period output unit 230 includes a NAND gate ND21 for performing a NAND operation with respect to the period measurement start signal RMS_PULSE2 and a test mode signal TM_REF2 for the self-refresh period measurement, a NAND gate ND22 for performing the NAND operation with respect to the delayed oscillation signal OSC2 and the test mode signal TM_REF2, and a latch 231 including NAND gates ND23 and ND24 interconnected in latch form. The NAND gate ND23 receives an output signal from the NAND gate ND21 at its one input terminal, and the NAND gate ND24 receives an output signal from the NAND gate ND22 at its one input terminal. The refresh period output unit 230 further includes an NMOS N22 that is voltage level hold means for holding an output terminal B of the latch 231 at a predetermined voltage level in response to the test mode signal TM_REF2.

The operation of the self-refresh period measurement circuit with the above-stated configuration according to the first embodiment will hereinafter be described in detail with reference to FIGS. 2a to 2d.

First, at a time t1 that the test mode signal TM_REF2 is enabled, the semiconductor device enters a test mode for measuring the self-refresh period. Subsequently, when the self-refresh signal SREF is enabled, the semiconductor device enters a self-refresh mode. Thereafter, when a control signal OSC_MEAS_ON is enabled high in level, the semiconductor device periodically performs the self-refresh operation. Here, the test mode signal TM_REF2 is a control signal that enables the test mode for measuring the self-refresh period. The self-refresh signal SREF is enabled from low to high in level upon input of a self-refresh command and then disabled from high to low in level upon completion of the self-refresh mode. The control signal OSC_MEAS_ON is a pulse that is enabled high in level when the semiconductor device enters the self-refresh mode, to indicate that the semiconductor device has entered the self-refresh mode. The semiconductor device performs a first cycle of the self-refresh operation at a time t2 that the control signal OSC_MEAS_ON is enabled.

Then, as shown in FIG. 2a, the shift register 210 receives the oscillation signal OSC and the test mode signal TM_REF2. Here, the oscillation signal OSC is a control signal that is periodically enabled after the self-refresh mode is entered, to allow the self-refresh operation to be periodically performed. The semiconductor device performs the self-refresh operation each time the control signal OSC makes a high level transition. In the present embodiment, the oscillation signal OSC allows the self-refresh operation to be performed periodically beginning with a second cycle.

When the test mode signal TM_REF2 makes a low to high level transition, the shift register 210 shifts the oscillation signal OSC by the unit self-refresh period to output the delayed oscillation signal OSC2. As a result, as shown in FIG. 2d, the delayed oscillation signal OSC2 from the shift register 210 is enabled for the first time at a time t4 that the oscillation signal OSC is enabled for the second time. Here, the shift register 210 can be implemented by any type of shift register which is enabled by a desired enable signal to shift an input signal by a desired period.

Meanwhile, the period measurement start signal generator 220 receives the self-refresh signal SREF and the oscillation signal OSC and generates the period measurement start signal RMS_PULSE2 for setting the time that the oscillation signal OSC is enabled for the first time as the start time for the self-refresh period measurement.

The operation of the period measurement start signal generator 220 will hereinafter be described in detail with reference to FIG. 2b. First, before the self-refresh signal SREF is enabled, namely, when it is low in level, the PMOS P21 is turned on to drive the node A to high in level. The latch 211 holds the state of the node A and, at the same time, outputs a low-level signal REF_MEAS_START to the signal generator 212. Then, in the signal generator 212, an inverter IV23 receives the low-level signal from the latch 211 and outputs a high-level signal, and a NOR gate NR21 outputs a low-level signal RMS_PULSE2 irrespective of an output signal from a delay 213. Thus, the period measurement start signal RMS_PULSE2 assumes a low level before the self-refresh signal SREF is enabled.

Thereafter, when the self-refresh signal SREF is enabled high in level as the semiconductor device enters the self-refresh mode, the PMOS P21 is turned off. Then, the control signal OSC_MEAS_ON is enabled high in level, so that the semiconductor device enters the self-refresh mode and performs the first cycle of the self-refresh operation. At this time, however, the NMOS N21 remains off in a period in which the oscillation signal OSC still remains low in level. On the other hand, the latch 211 holds the previous state, or high-level state, of the node A. As a result, the period measurement start signal RMS_PULSE2 remains low in level in a period from the time that the self-refresh signal SREF is enabled to the time that the oscillation signal OSC is enabled.

Next, at a time t3 that the oscillation signal OSC is enabled high in level as shown in FIG. 2d, the NMOS N21 is turned on to drive the node A to low in level. The latch 211 holds the state of the node A and, at the same time, outputs a high-level signal REF_MEAS_START to the signal generator 212. Then, in the signal generator 212, the inverter IV23 receives the high-level signal from the latch 211 and outputs a low-level signal to the NOR gate NR21. At this time, the delay 213 outputs a signal of the previous level, or low level, continuously for a predetermined delay period thereof. As a result, for the delay period from the time t3, the NOR gate NR21 receives the low-level signals at both input terminals thereof and outputs a high-level signal RMS_PULSE2. Thereafter, when the delay period has elapsed, the output of the delay 213 goes high in level and the NOR gate NR21 thus outputs a low-level signal RMS_PULSE2 in response to the high-level signal from the delay 213. The period measurement start signal RMS_PULSE2 remains low in level from then.

In this manner, the period measurement start signal RMS_PULSE2 from the period measurement start signal generator 220 is enabled high in level at the time t3 that the oscillation signal OSC is enabled for the first time and then disabled low in level after the lapse of the predetermined delay period of the delay 213. The time t3 that the period measurement start signal RMS_PULSE2 is enabled is taken as the start time for the self-refresh period measurement.

Finally, the refresh period output unit 230 receives the period measurement start signal RMS_PULSE2 and the delayed oscillation signal OSC2 from the shift register 210 and generates the refresh period output signal REF_OSC2 that is enabled for the period from the time that the period measurement start signal RMS_PULSE2 is enabled to the time that the delayed oscillation signal OSC2 is enabled for the first time, which will hereinafter be described in detail with reference to FIG. 2c.

First, before the test mode signal TM_REF2 is enabled, namely, when it is low in level, the NAND gate ND21 and NAND gate ND22 output high-level signals, and the NMOS N22 is turned on to drive the node B to low in level. As a result, in the latch 231, the output of the NAND gate ND24 becomes high in level and the output of the NAND gate ND23 becomes low in level, so as to hold the state of the node B. Then, in a period from the time t1 that the test mode signal TM_REF2 becomes high in level to the time t3, the test mode signal TM_REF2 is enabled, but both the period measurement start signal RMS_PULSE2 and delayed oscillation signal OSC2 are low in level. Accordingly, the NAND gate ND21 and NAND gate ND22 output high-level signals. The latch 231 holds the state of the node B at a low level although the NMOS N22 is turned off. Hence, in the period before the period measurement start signal RMS_PULSE2 is enabled, namely, before the time t3, the refresh period output signal REF_OSC2 assumes a low level.

Thereafter, when the period measurement start signal RMS_PULSE2 is enabled high in level as the time t3 is reached, the NAND gate ND21 receives the two high-level signals and outputs a low-level signal, thereby causing the NAND gate ND23 to output a high-level signal irrespective of the output signal from the NAND gate ND24. As a result, when the period measurement start signal RMS_PULSE2 is enabled, the refresh period output signal REF_OSC2 is enabled high in level. Meanwhile, the NAND gate ND24 receives the two high-level signals from the NAND gate ND22 and node B and outputs a low-level signal. As a result, the output signal from the NAND gate ND24, inputted to the NAND gate ND23, assumes a low level, so that the NAND gate ND23 still outputs the high-level signal although the period measurement start signal RMS_PULSE2 is disabled low in level and the output signal from the NAND gate ND21 thus goes high in level. Consequently, the refresh period output signal REF_OSC2 remains high in level in a period from the time t3 to the time t4.

Next, when the delayed oscillation signal OSC2 is enabled high in level as the time t4 is reached, the NAND gate ND22 receives the two high-level signals and outputs a low-level signal, thereby causing the NAND gate ND24 to output a high-level signal irrespective of the signal from the node B. At this time, the NAND gate ND21 outputs the high-level signal as stated above, so that the NAND gate ND23 performs the NAND operation with respect to the two high-level signals and outputs the resulting low-level signal. Consequently, at the time t4, if the delayed oscillation signal OSC2 is enabled high in level, the refresh period output signal REF_OSC2 is disabled low in level.

In this manner, the refresh period output unit 230 generates the refresh period output signal REF_OSC2 that is enabled for the period from the time t3 that the period measurement start signal RMS_PULSE2 is enabled to the time t4 that the delayed oscillation signal OSC2 is enabled for the first time. As can be seen from FIG. 2d, the time t3 is a time that the oscillation signal OSC is enabled for the first time, namely, that the second cycle of the self-refresh operation is started. The time t4 is a time that the oscillation signal OSC is enabled for the second time, namely, that a third cycle of the self-refresh operation is started. Therefore, the refresh period output signal REF_OSC2 has an enable width corresponding to the period from the time t3 to the time t4, namely, the period of the second cycle of the self-refresh operation, and the self-refresh period can be measured by counting the number of specific signals, such as clocks with a certain period, strobed for the enable period (from t3 to t4). In conclusion, the self-refresh period measurement circuit according to the first embodiment can measure a more accurate self-refresh period by measuring the period of the second self-refresh cycle exhibiting more stable and normal characteristics than the first self-refresh cycle.

Figure 3A:
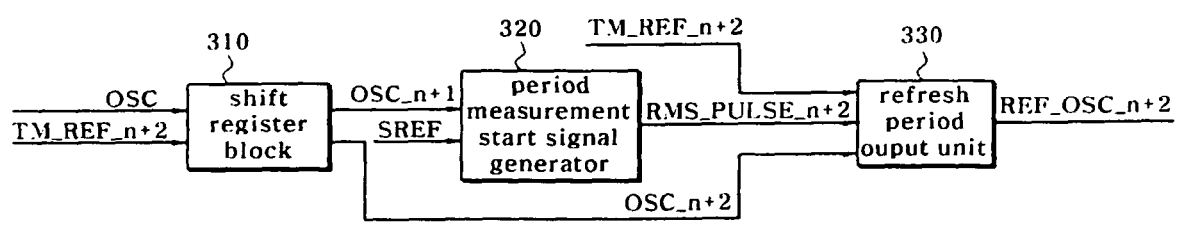
FIG. 3a is a block diagram showing the configuration of a self-refresh period measurement circuit of a semiconductor device according to a second embodiment of the present disclosure.
Figure 3B:
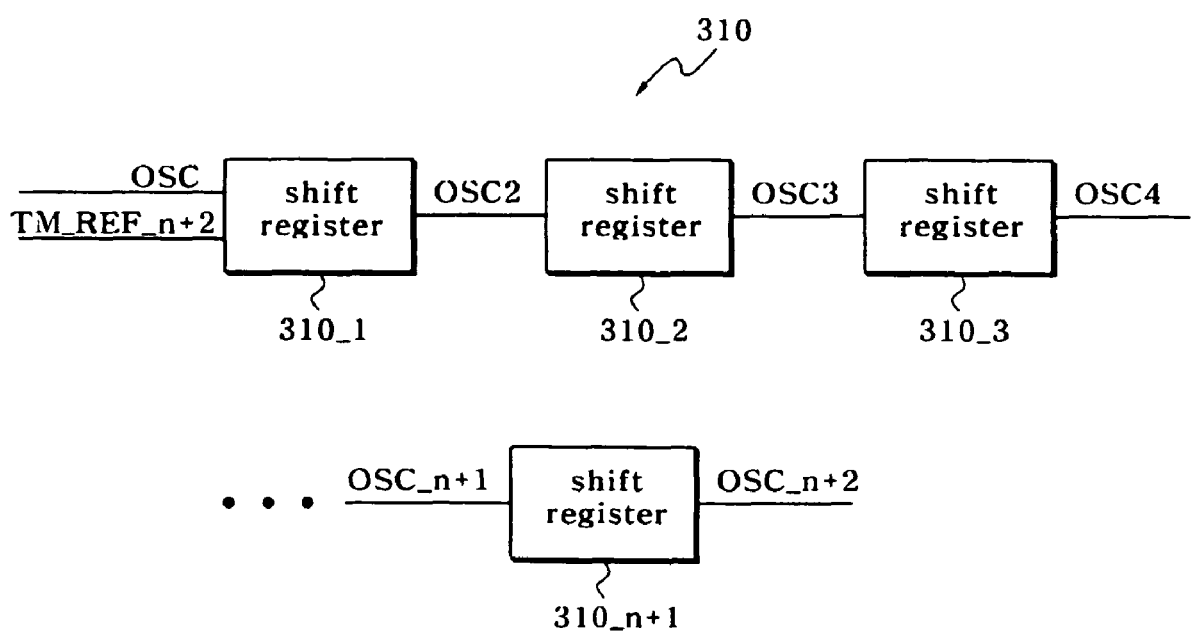
FIG. 3b is a block diagram of a shift register block in the self-refresh period measurement circuit according to the second embodiment.

FIG. 3a is a block diagram showing the configuration of a self-refresh period measurement circuit of a semiconductor device according to a second embodiment of the present disclosure, and FIG. 3b is a block diagram of a shift register block in the self-refresh period measurement circuit according to the second embodiment. The self-refresh period measurement circuit of the semiconductor device according to the second embodiment will hereinafter be described with reference to these figures.

The self-refresh period measurement circuit according to the second embodiment comprises a shift register block 310 for receiving an oscillation signal OSC that is periodically enabled after a self-refresh signal SREF is enabled, to allow a self-refresh operation to be performed, and delaying the received oscillation signal OSC by n x unit self-refresh period to output a first delayed oscillation signal OSC_n+1 and by (n+1) x unit self-refresh period to output a second delayed oscillation signal OSC_n+2 (where n is a natural number), a period measurement start signal generator 320 for receiving the self-refresh signal SREF and the first delayed oscillation signal OSC_n+1 and generating a period measurement start signal RMS_PULSE_n+2 for setting a time that the first delayed oscillation signal OSC_n+1 is enabled for the first time as a start time for measurement of a self-refresh period, and a refresh period output unit 330 for receiving the period measurement start signal RMS_PULSE_n+2 and the second delayed oscillation signal OSC_n+2 and generating a refresh period output signal REF_OSC_n+2 that is enabled for a period from a time that the period measurement start signal RMS_PULSE_n+2 is enabled to a time that the second delayed oscillation signal OSC_n+2 is enabled for the first time.

The shift register block 310 includes a plurality of shift registers 310_1 to 310_n+1, each for shifting an input signal by a unit self-refresh period. The shift registers 310_1 to 310_n+1 are connected in series.

The operation of the self-refresh period measurement circuit with the above-stated configuration according to the second embodiment will hereinafter be described in detail with reference to FIGS. 3a and 3b.

First, similarly to in the first embodiment, when a test mode signal TM_REF_n+2 is enabled, the semiconductor device enters a test mode for measuring the self-refresh period. Subsequently, when the self-refresh signal SREF is enabled, the semiconductor device enters a self-refresh mode. Thereafter, when a control signal OSC_MEAS_ON is enabled high in level, the semiconductor device periodically performs the self-refresh operation. Here, the test mode signal TM_REF_n+2 is a control signal that enables the test mode for measuring the self-refresh period, more particularly the period of an (n+2)th self-refresh cycle. The self-refresh signal SREF and the control signal OSC_MEAS_ON are the same as those in the first embodiment.

Then, as shown in FIG. 3a, the shift register block 310 receives the oscillation signal OSC and the test mode signal TM_REF_n+2. Similarly to that in the first embodiment, the oscillation signal OSC is a control signal that is periodically enabled after the self-refresh mode is entered, to allow the self-refresh operation to be periodically performed. In the present embodiment, the control signal OSC allows the self-refresh operation to be performed periodically beginning with a second cycle.

The shift register block 310 includes the (n+1) shift registers 310_1 to 310_n+1 connected in series, each of which shifts an input signal by the unit self-refresh period. Thus, when the test mode signal TM_REF_n+2 makes a low to high level transition, the shift register block 310 delays the oscillation signal OSC by n x unit self-refresh period to output the first delayed oscillation signal OSC_n+1 and by (n+1) x unit self-refresh period to output the second delayed oscillation signal OSC_n+2. As a result, the first delayed oscillation signal OSC_n+1 is enabled for the first time at a time that the oscillation signal OSC is enabled for the (n+1) time, and the second delayed oscillation signal OSC_n+2 is enabled for the first time at a time that the oscillation signal OSC is enabled for the (n+2) time. Here, each of the shift registers 310_1 to 310_n+1 can be implemented by any type of shift register which is enabled by a desired enable signal to shift an input signal by a desired period. Particularly, in the present embodiment, the shift register 310_1 is operated in response to the test mode signal TM_REF_n+2.

Then, the period measurement start signal generator 320 receives the self-refresh signal SREF and the first delayed oscillation signal OSC_n+1 and generates the period measurement start signal RMS_PULSE_n+2 for setting the time that the first delayed oscillation signal OSC_n+1 is enabled for the first time as the start time for the self-refresh period measurement. The period measurement start signal generator 320 in this embodiment is the same in configuration as the period measurement start signal generator 220 in the first embodiment, with the exception that the first delayed oscillation signal OSC_n+1 is inputted instead of the oscillation signal OSC. Accordingly, the period measurement start signal generator 320 is operated in the same manner as the period measurement start signal generator 220 in the first embodiment. Consequently, the period measurement start signal RMS_PULSE_n+2 from the period measurement start signal generator 320 is enabled high in level at the time that the first delayed oscillation signal OSC_n+1 is enabled for the first time and then disabled low in level after the lapse of a predetermined delay period of a delay (not shown) in the period measurement start signal generator 320. The time that the period measurement start signal RMS_PULSE_n+2 is enabled is taken as the start time for the self-refresh period measurement.

Finally, the refresh period output unit 330 receives the period measurement start signal RMS_PULSE_n+2 and the second delayed oscillation signal OSC_n+2 from the shift register block 310 and generates the refresh period output signal REF_OSC_n+2 that is enabled for the period from the time that the period measurement start signal RMS_PULSE_n+2 is enabled to the time that the second delayed oscillation signal OSC_n+2 is enabled for the first time. The refresh period output unit 330 in this embodiment is the same in configuration as the refresh period output unit 230 in the first embodiment, with the exception that the period measurement start signal RMS_PULSE_n+2 is inputted instead of the period measurement start signal RMS_PULSE2, the test mode signal TM_REF_n+2 is inputted instead of the test mode signal TM_REF2 and the second delayed oscillation signal OSC_n+2 is inputted instead of the delayed oscillation signal OSC2.

Accordingly, the refresh period output unit 330 is operated in the same manner as the refresh period output unit 230 in the first embodiment. Consequently, the refresh period output signal REF_OSC_n+2 from the refresh period output unit 330 is enabled for the period from the time that the period measurement start signal RMS_PULSE_n+2 is enabled to the time that the second delayed oscillation signal OSC_n+2 is enabled for the first time. The time that the period measurement start signal RMS_PULSE n+2 is enabled is a time that the (n+2)th cycle of the self-refresh operation is started. The time that the second delayed oscillation signal OSC_n+2 is enabled for the first time is a time that an (n+3)th cycle of the self-refresh operation is started. Therefore, the refresh period output signal REF_OSC_n+2 has an enable width corresponding to the period between the above two times, namely, the period of the (n+2)th cycle of the self-refresh operation, and the self-refresh period can be measured by counting the number of specific signals, such as clocks with a certain period, strobed for the enable period. According to the second embodiment, assuming that n=10, the period of a twelfth self-refresh cycle can be measured. In conclusion, the self-refresh period measurement circuit according to the second embodiment can measure a more accurate self-refresh period by measuring the period of an nth self-refresh cycle exhibiting more stable and normal characteristics than the first self-refresh cycle.

Figure 4A:
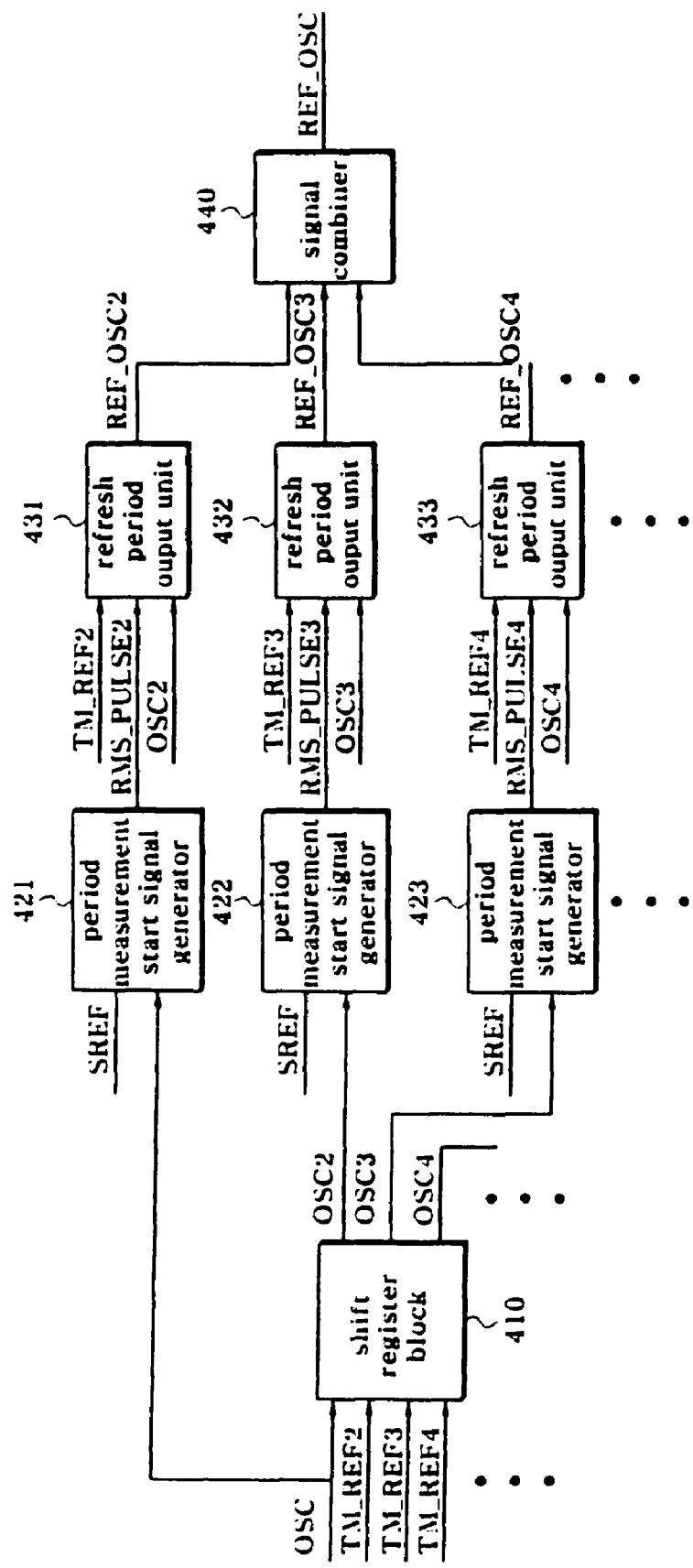
FIG. 4a is a block diagram showing the configuration of a self-refresh period measurement circuit of a semiconductor device according to a third embodiment of the present disclosure.
Figure 4B:
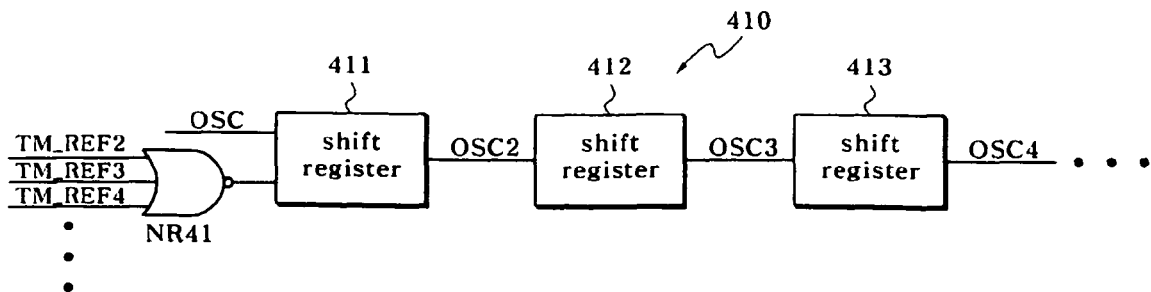
FIG. 4b is a block diagram of a shift register block in the self-refresh period measurement circuit according to the third embodiment.
Figure 4C:
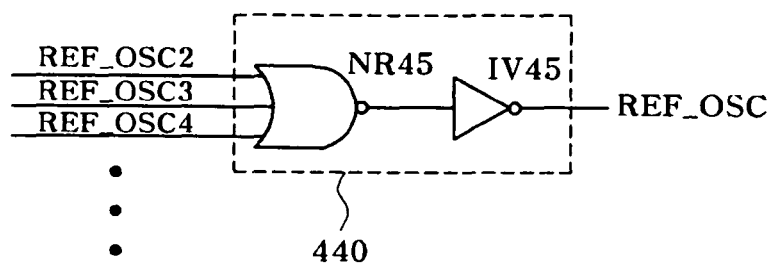
FIG. 4c is a circuit diagram of a signal combiner in the self-refresh period measurement circuit according to the third embodiment.

FIG. 4a is a block diagram showing the configuration of a self-refresh period measurement circuit of a semiconductor device according to a third embodiment of the present disclosure, FIG. 4b is a block diagram of a shift register block in the self-refresh period measurement circuit according to the third embodiment, and FIG. 4c is a circuit diagram of a signal combiner in the self-refresh period measurement circuit according to the third embodiment.

As shown in FIG. 4a, the self-refresh period measurement circuit of the semiconductor device according to the third embodiment is a combination of the self-refresh period measurement circuit according to the first embodiment and the self-refresh period measurement circuit according to the second embodiment. That is, a shift register 411 which is included in a shift register block 410 and adapted to output a delayed oscillation signal OSC2 is the same as the shift register 210 in the first embodiment, a period measurement start signal generator 421 is the same as the period measurement start signal generator 220 in the first embodiment, and a refresh period output unit 431 is the same as the refresh period output unit 230 in the first embodiment.

Also, the shift register block 410 is the same as the shift register block 310 in the second embodiment in that it includes a plurality of shift registers to output a plurality of delayed oscillation signals. Period measurement start signal generators 422, 423, . . . are the same as a plurality of period measurement start signal generators 320 which are configured with the natural number n increasing in the second embodiment. Refresh period output units 432, 433, . . . are the same as a plurality of refresh period output units 330 which are configured with the natural number n increasing in the second embodiment.

In the third embodiment, additional elements are provided in the combination of the first embodiment and second embodiment, as will hereinafter be described. First, as shown in FIGS. 4a and 4b, the shift register block 410 in the third embodiment is configured to be enabled by a signal obtained by NoRing a plurality of test mode signals TM_REF2, TM_REF3, . . . . Here, each of the test mode signals TM_REF2, TM_REF3, . . . is a control signal that enables a test mode for measuring a self-refresh period, more particularly the period of a corresponding one of second, third, . . . self-refresh cycles. For example, the test mode signal TM_REF5 is a control signal for measurement of the period of the fifth self-refresh cycle. Hence, the shift register block 410 is operated when at least one of the test mode signals TM_REF2, TM_REF3, . . . is enabled.

Also, as shown in FIGS. 4a and 4c, the self-refresh period measurement circuit according to the third embodiment further comprises a signal combiner 440. The signal combiner 440 performs an OR operation with respect to respective refresh period output signals REF_OSC2, REF_OSC3, . . . from the refresh period output units 431, 432, . . . to output a final refresh period output signal REF_OSC. That is, provided that any one of the plurality of test mode signals TM_REF2, TM_REF3, . . . is enabled, a refresh period output signal corresponding to the enabled test mode signal will be enabled at a predetermined time. In this connection, the signal combiner 440 can output a desired refresh period output signal as the signal REF_OSC by ORing the refresh period output signals REF_OSC2, REF_OSC3, . . . . For example, in the case where the period of a tenth self-refresh cycle is desired to be known, a test mode signal TM_REF10 is enabled and a refresh period output signal REF_OSC10 is thus outputted in the form of the final refresh period output signal REF_OSC, so that the period of the tenth self-refresh cycle can be measured. In conclusion, the self-refresh period measurement circuit according to the third embodiment can measure a more accurate self-refresh period by selectively measuring the period of an nth self-refresh cycle exhibiting more stable and normal characteristics than the first self-refresh cycle.

Figure 5A:
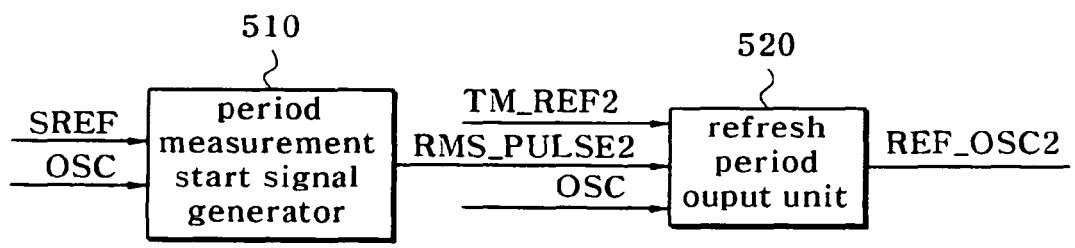
FIG. 5a is a block diagram showing the configuration of a self-refresh period measurement circuit of a semiconductor device according to a fourth embodiment of the present disclosure.
Figure 5B:
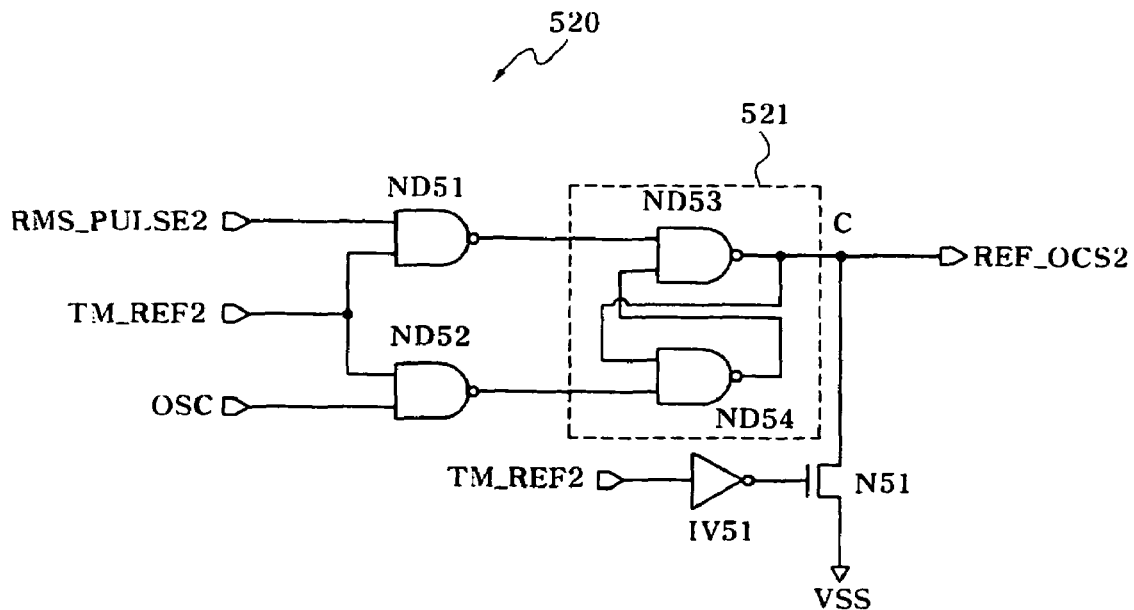
FIG. 5b is a circuit diagram of a refresh period output unit in the self-refresh period measurement circuit according to the fourth embodiment.
Figure 5C:
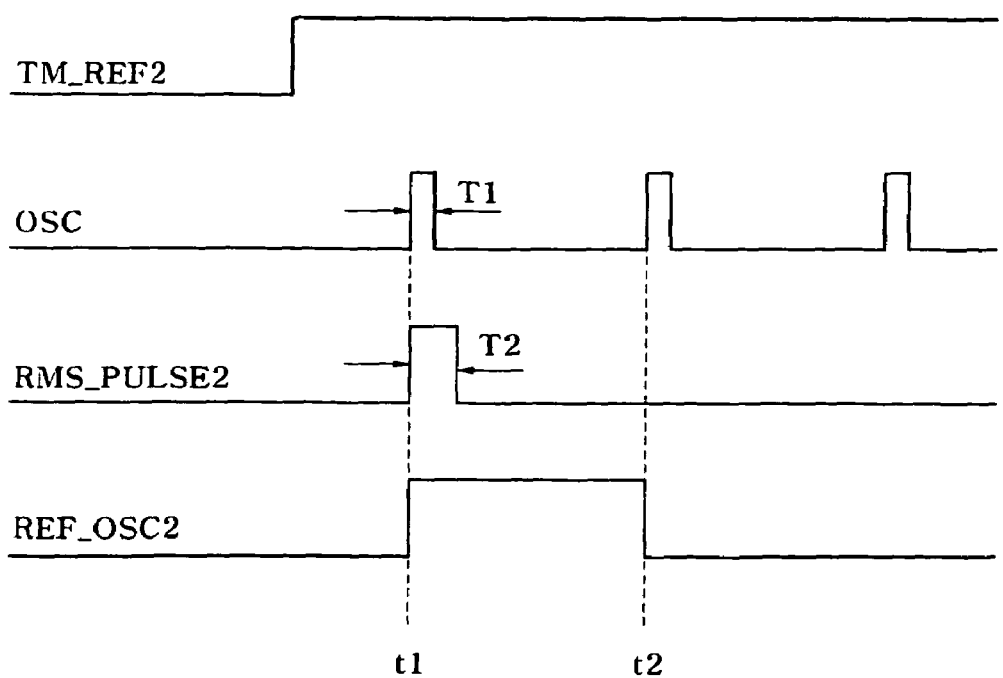
FIG. 5c is a timing diagram showing the waveforms of respective signals in the self-refresh period measurement circuit according to the fourth embodiment.

FIG. 5a is a block diagram showing the configuration of a self-refresh period measurement circuit of a semiconductor device according to a fourth embodiment of the present disclosure, FIG. 5b is a circuit diagram of a refresh period output unit in the fourth embodiment, and FIG. 5c is a timing diagram showing the waveforms of respective signals in the self-refresh period measurement circuit according to the fourth embodiment. The self-refresh period measurement circuit of the semiconductor device according to the fourth embodiment will hereinafter be described with reference to FIGS. 5a to 5c.

The self-refresh period measurement circuit according to the fourth embodiment comprises a period measurement start signal generator 510 for receiving a self-refresh signal SREF and an oscillation signal OSC that is periodically enabled by a first width T1 after the self-refresh signal SREF is enabled, to allow a self-refresh operation to be performed, and generating a period measurement start signal RMS_PULSE2 that is enabled by a second width T2 at a time t1 that the oscillation signal OSC is enabled for the first time, to set the time t1 as a start time for measurement of a self-refresh period, and a refresh period output unit 520 for receiving the period measurement start signal RMS_PULSE2 and the oscillation signal OSC and generating a refresh period output signal REF_OSC2 that is enabled for a period from the time t1 that the period measurement start signal RMS_PULSE2 is enabled to a time t2 that the oscillation signal OSC is enabled for the second time.

The refresh period output unit 520 includes a NAND gate ND51 for performing a NAND operation with respect to the period measurement start signal RMS_PULSE2 and a test mode signal TM_REF2 for the self-refresh period measurement, a NAND gate ND52 for performing the NAND operation with respect to the oscillation signal OSC and the test mode signal TM_REF2, and a latch 521 including NAND gates ND53 and ND54 interconnected in latch form. The NAND gate ND53 receives an output signal from the NAND gate ND51 at its one input terminal, and the NAND gate ND54 receives an output signal from the NAND gate ND52 at its one input terminal. The refresh period output unit 520 further includes an NMOS N51 that is voltage level hold means for holding an output terminal C of the latch 521 at a predetermined voltage level in response to the test mode signal TM_REF2.

The operation of the self-refresh period measurement circuit with the above-stated configuration according to the fourth embodiment will hereinafter be described in detail with reference to FIGS. 5a to 5c.

First, when the test mode signal TM_REF2 is enabled, the semiconductor device enters a test mode for measuring the self-refresh period. Subsequently, when the self-refresh signal SREF is enabled, the semiconductor device enters a self-refresh mode. Thereafter, when a control signal OSC_MEAS_ON is enabled high in level, the semiconductor device periodically performs the self-refresh operation. Here, the test mode signal TM_REF2, self-refresh signal SREF and control signal OSC_MEAS_ON are the same as those in the first embodiment.

Then, as shown in FIG. 5a, the period measurement start signal generator 510 receives the self-refresh signal SREF and the oscillation signal OSC and generates the period measurement start signal RMS_PULSE2 for setting the time t1 that the oscillation signal OSC is enabled for the first time as the start time for the self-refresh period measurement. Here, the oscillation signal OSC is a control signal that is periodically enabled after the self-refresh mode is entered, to allow the self-refresh operation to be periodically performed. The oscillation signal OSC is the same as that in the first embodiment, with the exception that it has the enable width T1 as shown in FIG. 5c.

Also, the configuration of the period measurement start signal generator 510 is the same as that of the period measurement start signal generator 220 in the first embodiment and the basic operation thereof is thus the same as that in the first embodiment. However, in the fourth embodiment, the delay time of a delay (not shown) included in the period measurement start signal generator 510 is set to be larger than the width T1 such that the period measurement start signal generator 510 is designed to generate the period measurement start signal RMS_PULSE2 which has the enable width T2 larger than the enable width T1 of the oscillation signal OSC. That is, the period measurement start signal RMS_PULSE2 from the period measurement start signal generator 510 is enabled high in level by the width T2 at the time t1 that the oscillation signal OSC is enabled for the first time.

Then, the refresh period output unit 520 receives the period measurement start signal RMS_PULSE2 and the oscillation signal OSC and generates the refresh period output signal REF_OSC2 that is enabled for the period from the time that the period measurement start signal RMS_PULSE2 is enabled to the time that the oscillation signal OSC is enabled for the second time, which will hereinafter be described in detail with reference to FIG. 5b.

First, in a period from the time that the test mode signal TM_REF2 is enabled to the time t1 that the period measurement start signal RMS_PULSE2 and the oscillation signal OSC are enabled, the refresh period output signal REF_OSC2 assumes a low level in the same manner as that in the first embodiment.

Thereafter, when the time t1 is reached, the period measurement start signal RMS_PULSE2 and the oscillation signal OSC are enabled high in level. As a result, the NAND gate ND51 receives the two high-level signals and outputs a low-level signal, thereby causing the NAND gate ND53 to output a high-level signal irrespective of the output signal from the NAND gate ND54. Also, the NAND gate ND52 receives the two high-level signals and outputs a low-level signal, thereby causing the NAND gate ND54 to output a high-level signal irrespective of the signal from the node C. Hence, when the period measurement start signal RMS_PULSE2 and oscillation signal OSC are enabled, the refresh period output signal REF_OSC2 is enabled high in level.

Thereafter, when the oscillation signal OSC makes a high to low level transition first, the NAND gate ND52 outputs a high-level signal in response to the low-level oscillation signal OSC. At this time, because the signal of the node C is high in level, the NAND gate ND54 receives the two high-level signals and outputs a low-level signal. Accordingly, the NAND gate ND53 receives the two low-level signals and outputs the high-level signal continuously.

Next, when the period measurement start signal RMS_PULSE2 also makes a high to low level transition, the NAND gate ND51 outputs a high-level signal in response to the low-level period measurement start signal RMS_PULSE2. At this time, because the output signal from the NAND gate ND54 is low in level, the NAND gate ND53 outputs the high-level signal continuously irrespective of the output signal from the NAND gate ND51.

Thereafter, when the oscillation signal OSC is enabled high in level as the time t2 is reached, the NAND gate ND52 receives the two high-level signals and outputs a low-level signal, thereby causing the NAND gate ND54 to output a high-level signal irrespective of the signal from the node C. At this time, because the output signal from the NAND gate ND51 is high in level as stated above, the NAND gate ND53 performs the NAND operation with respect to the two high-level signals and outputs the resulting low-level signal. Consequently, at the time t2, if the oscillation signal OSC is enabled high in level, the refresh period output signal REF_OSC2 is disabled low in level.

In this manner, the refresh period output unit 520 generates the refresh period output signal REF_OSC2 that is enabled for the period from the time t1 that the period measurement start signal RMS_PULSE2 is enabled to the time t2 that the oscillation signal OSC is enabled for the second time. As can be seen from FIG. 5c, the time t1 is a time that the oscillation signal OSC is enabled for the first time, namely, that the second cycle of the self-refresh operation is started. The time t2 is a time that the oscillation signal OSC is enabled for the second time, namely, that the third cycle of the self-refresh operation is started. Accordingly, the refresh period output signal REF_OSC2 has an enable width corresponding to the period from the time t1 to the time t2, namely, the period of the second cycle of the self-refresh operation, and the self-refresh period can be measured by counting the number of specific signals, such as clocks with a certain period, strobed for the enable period (from t1 to t2). In conclusion, similarly to that according to the first embodiment, the self-refresh period measurement circuit according to the fourth embodiment can measure a more accurate self-refresh period by measuring the period of the second self-refresh cycle exhibiting more stable and normal characteristics than the first self-refresh cycle.

Although the self-refresh period measurement circuit according to the fourth embodiment is somewhat different in configuration from that according to the first embodiment, it can measure the period of the second self-refresh cycle similarly to that according to the first embodiment by making the enable width T2 of the period measurement start signal RMS_PULSE2 from the period measurement start signal generator 510 adequately larger than the enable width T1 of the oscillation signal OSC.

As described above, according to the first to fourth embodiments of the present disclosure, the self-refresh period measurement circuit can measure a more accurate self-refresh period by measuring the period of the second or subsequent self-refresh cycle exhibiting more stable and normal characteristics than the first self-refresh cycle. Furthermore, in an auto Temperature Compensated Self Refresh (TCSR) circuit used in a mobile device or the like, it is possible to accurately measure a self-refresh period based on a temperature variation.

As apparent from the above description, the present disclosure provides a self-refresh period measurement circuit of a semiconductor device which is capable of measuring a more accurate self-refresh period of the semiconductor device by measuring the period of a second or subsequent self-refresh cycle exhibiting more stable and normal characteristics than a first self-refresh cycle. In addition, in an auto TCSR circuit used in a mobile device or the like, it is possible to accurately measure a self-refresh period based on a temperature variation.

Although preferred embodiments in the present disclosure have been disclosed for illustrative purposes, those skilled in the art will appreciate that various modifications, additions and substitutions are possible, without departing from the spirit of the disclosure and scope of the accompanying claims. For example, elements and/or features of different examples and illustrative embodiments may be combined with each other and/or substituted for each other within the scope of this disclosure and the appended claims.

Further, as another example, the illustrative embodiments above utilize various examples of a shift register block as delay means for delaying the oscillation signal to obtain a delayed oscillation signal to be utilized as a control signal for triggering self-refresh operation. However, it should be appreciated that other configurations of a delay device can alternatively be used.

In addition, as should be apparent to one skilled in the art in view of the discussion above, the examples of period measurement start signal generators and refresh period output units in the illustrative embodiments herein merely include exemplary configurations of a period measurement start signal generator and a refresh period output unit, and the period measurement start signal generator and the refresh period output unit can be configured in a manner other than as discussed herein, so long as the same or signal generator and the refresh period output unit can be configured in a manner other than as discussed herein, so long as the same or similar functions are achieved.

What is claimed is:

1. A self-refresh period measurement circuit of semiconductor device comprising:
    a period measurement start signal generator for configured to receive a self-refresh signal and an oscillation signal that is periodically enabled by a first width after the self-refresh signal is enabled, to allow a self-refresh operation to be performed, and generate a period measurement start signal that is enabled by a second width at a time that the oscillation signal is enabled for the first time, to set the time that the oscillation signal is enabled for the first time as a start time for measurement of a self-refresh period; and
    a refresh period output unit configured to receive the period measurement start signal and the oscillation signal, and generate a refresh period output signal that is enabled for a period from the time that the period measurement start signal is enabled to a time that the oscillation signal is enabled for the second time.

2. The self-refresh period measurement circuit as set forth in claim 1, wherein the second width is larger than the first width.

3. The self-refresh period measurement circuit as set forth in claim 2, wherein the period measurement start signal generator comprises:
    a pull-up device configured to pull a specific node up in response to the self-refresh signal;
    a pull-down device configured to pull the node down in response to the oscillation signal;
    a latch configured to latch a signal of the node; and
    a signal generator configured to output a pulse signal that is enabled by the second width from a time that an output signal from the latch makes a level transition, as the period measurement start signal, in response to the level transition of the output signal from the latch.

4. The self-refresh period measurement circuit as set forth in claim 3, wherein the signal generator comprises:
    a delay configured to delay the output signal from the latch by the second width;
    a buffer configured to buffer the output signal from the latch; and
    a logic device configured to perform a logic operation with respect to an output signal from the delay and an output signal from the buffer.

5. The self-refresh period measurement circuit as set forth in claim 4, wherein the buffer is an inverter, and the inverter performs an inverting operation.

6. The self-refresh period measurement circuit as set forth in claim 4, wherein the logic device performs a NOR operation.

7. The self-refresh period measurement circuit as set forth in claim 1, wherein the refresh period output unit comprises:
    a first logic device configured to perform a logic operation with respect to the period measurement start signal and a test mode signal for the self-refresh period measurement;
    a second logic device configured to perform a logic operation with respect to the oscillation signal and the test mode signal; and
    a latch including third and fourth logic devices interconnected in latch form, the third logic device receiving an output signal from the first logic device at its one input terminal, the fourth logic device receiving an output signal from the second logic device at its one input terminal.

8. The self-refresh period measurement circuit as set forth in claim 7, wherein each of the first to fourth logic devices is a NAND gate.

9. The self-refresh period measurement circuit as set forth in claim 7, wherein the refresh period output unit further comprises voltage level hold means for holding an output terminal of the latch at a predetermined voltage level in response to the test mode signal.

* * * * *